(12) United States Patent
Honeycutt

(10) Patent No.: US 6,495,406 B1
(45) Date of Patent: Dec. 17, 2002

(54) METHOD OF FORMING LIGHTLY DOPED DRAIN MOS TRANSISTOR INCLUDING FORMING SPACERS ON GATE ELECTRODE PATTERN BEFORE EXPOSING GATE INSULATOR

(75) Inventor: Jeffrey W. Honeycutt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 17 days.

(21) Appl. No.: 09/652,320

(22) Filed: Aug. 31, 2000

(51) Int. Cl.⁷ .................... H01L 21/336; H01L 21/8234
(52) U.S. Cl. ................. 438/197; 438/299; 438/301; 438/303; 438/585
(58) Field of Search .................... 438/197, 229–232, 438/299, 301, 303, 305–307, 585, 586, 592, 595, 970; 257/381, 408, 413

(56) References Cited

U.S. PATENT DOCUMENTS

| 4,978,626 A | * 12/1990 | Poon et al. ................. 438/220 |
| 5,032,530 A | 7/1991 | Lowrey et al. ............... 437/34 |
| 5,162,248 A | 11/1992 | Dennison et al. ............ 437/52 |
| 5,413,945 A | 5/1995 | Chien et al. ................. 437/35 |
| 5,585,295 A | * 12/1996 | Wu ............................ 438/305 |

* cited by examiner

Primary Examiner—Matthew Smith
Assistant Examiner—Craig P. Lytle
(74) Attorney, Agent, or Firm—Fletcher, Yoder & Van Someren

(57) ABSTRACT

A method of forming a MOS transistor in an upper surface of a semiconductor substrate. A gate oxide layer covers the upper surface of the substrate. A gate stack comprising one or more thin film layers covers the gate oxide layer. A gate electrode pattern is partially etched into the gate stack, the partial etching step being completed before any of the gate oxide layer is exposed. Sidewall spacers are formed on edge surfaces of the partially formed gate electrode. Source and drain regions are created by ion implantation using the partially etched gate electrode and the sidewall spacers as a mask. The sidewall spacers are removed and lightly doped drain regions are formed by ion implantation using the partially etched gate electrode as a mask.

19 Claims, 2 Drawing Sheets

METHOD OF FORMING LIGHTLY DOPED DRAIN MOS TRANSISTOR INCLUDING FORMING SPACERS ON GATE ELECTRODE PATTERN BEFORE EXPOSING GATE INSULATOR

BACKGROUND OF THE INVENTION

1. Field of the Invention

The present invention relates, in general, to process for fabricating MOS integrated circuits, and, more particularly, to MOS or CMOS integrated circuits having a lightly doped drain (LDD) structure in which a portion of the drain nearest the channel is less strongly doped than other regions of the source and drain.

2. State of the Art

In the manufacture of high density integrated circuits using metal oxide semiconductor field effect transistor (MOSFET) technology, as device dimensions decrease, there is a need to create shallower source and drain junctions. However, correspondingly abrupt or steep $n^+$ doping profiles in NMOS transistor lead to increased electric fields in the device channel in a region adjacent to the drain. The high electric field causes electrons in the device channel to gain significant energy and be injected into the gate oxide. This phenomenon is also known as the "hot carrier" effect that leads to long term device degradation, threshold shifts, and poor reliability.

In lightly doped drain (LDD) structures, regions of the source and drain near the channel are less heavily doped than regions of the source and drain farther away from the channel. The lateral grading of the $n^+$ doping profile provided by lower doping near the gate electrode reduces the electric fields near the drain, improves the speed and reliability of the device, lowers the gate-source and gate-drain capacitance, and minimizes hot electron injection into the gate.

In a conventional LDD process, the gate electrode is used as a mask for the $n^-$ LDD implantation. Subsequently, sidewall oxide spacers are formed creating a narrower open region laterally spaced from the gate electrode in which a heavier source/drain implant is performed. In this manner, the LDD region is formed and the sidewall spacer can be retained preventing the damage caused by the sidewall spacer removal.

In processes in which the heavily doped drain is formed after the LDD implant, the LDD region will be subject to all thermal processing required to anneal and drive in the heavier drain implant. This loss of control results in diffusive broadening of the LDD region during high temperature treatments. However, the high dose source/drain implants, which in the conventional LDD process are performed after the LDD implant and spacer formation, must be annealed at high temperature to remove ion implantation damage.

Alternative processes are known that form the LDD region after the source/drain implant. In one process, the LDD region surrounding the gate electrode is masked with a layer slightly thicker than the gate to protect regions of the silicon adjacent to the gate electrode. Regions of the silicon further out are then doped with a first doping process and the mask removed to allow a lighter doping of the regions nearer the gate with a second doping process. In another known LDD process, a region of silicon dioxide is formed as a sacrificial or disposable spacer along the sides of the gate electrode and the silicon left exposed by the spacer is heavily doped to form source/drain regions. The disposable spacer is removed to expose regions near the gate previously covered by the spacers. The regions near the gate are then lightly doped with a second doping process.

Unfortunately, the etch used to remove the spacers causes damage in the gate oxide. Damage to the gate oxide significantly impacts yield and reliability. Another problem in the conventional processes using sidewall spacers is that substrate damage occurs in the LDD region during the sidewall spacer etch. Sidewall formation is accomplished by anisotropic etching using plasma techniques. Exposed silicon during the plasma etch is damaged requiring subsequent anneal, or damage removal processing to eliminate leakage and other electrical deficiencies caused by the defects. What is needed is a lightly doped drain process that allows formation of the heavily doped source/drain and sidewall due to sidewall spacers and the associated anneal processes while allowing independent control of the thermal budget for the LDD region.

SUMMARY OF THE INVENTION

Briefly stated, the present invention involves a lightly doped drain (LDD) process for forming MOS or CMOS transistors. A substrate with appropriate field oxide regions formed thereon is provided. A gate insulator layer is formed on active areas of the substrate. A first gate electrode layer preferably comprising polysilicon is formed over the gate oxide layer. An etch stop layer is formed on the upper surface of the first gate electrode layer. A second gate electrode layer covers the etched stop layer. Optionally, an oxide layer is formed covering the second gate electrodes layer. The oxide layer, if used, in the second gate electrode layer are patterned using conventional photoresist technology and etched so as to stop on the etch stop layer.

In this manner, the gate pattern is transferred to the semiconductor device, but the gate electrode is not completely formed. The spacer oxide layer is deposited over the partially etched gate electrode structure. The deposited oxide is anisotropically etched to form sidewall spacers covering the lateral sidewalls of the partially etched gate electrode. A high current source/drain implant is performed through the etch stop layer, the first gate electrode layer, and the gate oxide layer to form heavily doped portions of source and drain regions. Subsequently, the sidewall spacer is removed in a process that stops on the etch stop layer.

A relatively low concentration of impurities are implanted into the substrate through the etch stop, first gate electrode, and gate oxide layer. The etch stop, first gate electrode, and gate oxide layers are etched using the partially formed gate electrode as a mask to completely form the gate electrode. The LDD structure formed in accordance with the present invention is then processed through conventional electrode and wiring formation to form completed devices.

DETAILED DESCRIPTION OF THE DRAWING

1. Overview

The present invention involves a method of fabricating a lightly doped drain (LDD) MOS transistor. The present invention is applicable to NMOS, PMOS, CMOS, BiCMOS and similar MOS processes. While the present invention is described in terms of formation of an NMOS transistor, it is readily apparent that PMOS transistors can be formed merely by selecting appropriate impurities with opposite conductivity to that described in the preferred embodiment.

In accordance with the present invention, the lightly doped drain region can be formed after the heavily doped drain region allowing independent control of the diffusion profile of the lightly doped drain region. This is particularly advantageous in high density MOS devices where drain doping profile affects not only device performance, but long term reliability of the device. It is also an advantage of the present invention that the silicon surface in either the lightly doped or heavily doped regions is not exposed during the harsh processes of high current ion implantation and spacer formation and removal. This protects the pristine quality of the silicon surface improving device performance and simplifying subsequent processing.

The description of the preferred embodiment encompasses only a portion of the formation of a practical integrated circuit device. Typically, integrated circuits are formed in active areas defined by isolation regions that serve to electrically isolate active areas on an integrated circuit. The present invention is compatible with all forms of isolation technology including LOCOS, SILOS, trench isolation, and the like. Similarly, the present invention is compatible with all forms of "back end" processing for formation of contacts and metallization including multi-layer metallization processes. For ease of description and clarity, these processes are not described herein.

2. Gate Stack Formation

Figure 1:
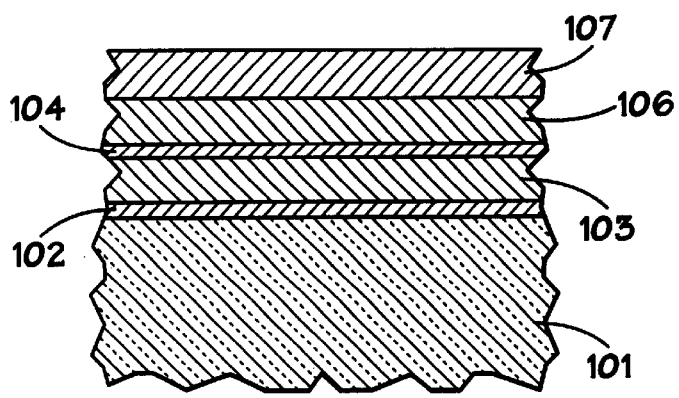
FIG. 1 is a cross-section of a view of an enlarged semiconductor structure in accordance with the present invention in an early stage in processing.

Substrate 101 shown in FIG. 1 is a semiconductor substrate having a polished surface suitable for manufacture of semiconductor devices. Semiconductor substrate 101 preferably comprises single crystal silicon that is undoped, or doped with p-type impurities to a desired concentration. The upper surface of substrate 101 shown in FIG. 1 may also be appropriately doped epitaxial single crystal silicon.

A thin gate oxide 102 is formed over the upper surfaces of substrate 101. Thin gate oxide 102 is preferably formed by thermal oxidation to a thickness of between 50 Å and 500 Å using well known techniques. Gate oxide 102 is subsequently covered with a first electrode 103. First electrode 103 preferable comprises doped or undoped polysilicon formed by any known technique. First electrode 103 may be covered with a metal silicide layer (not shown) such as $WSi_x$ to lower its resistivity.

Etch stop layer 104 is formed over first electrode layer 103. Etch stop layer 104 may be a very thin deposited oxide, native oxide, thermally grown oxide, a conductive layer such as silicide, or an undoped region at the upper surface of electrode layer 103. Etch stop layer 104 serves to indicate during subsequent etch processing when it has been reached. Hence, so long as the composition of etch stop layer 104 differs from the overlying layers (described hereinafter) etch stop layer 104 will function in accordance with the present invention. Where electrode layer 103 comprises an undoped polysilicon and overlying layer 106 comprises doped polysilicon, etch stop layer 104 can be eliminated entirely because a polysilicon etch can be controlled to stop when the etch has passed from the doped poly to the undoped poly.

Etch stop layer 104, if used, is covered by a second electrode layer 106. Preferably second electrode layer 106 comprises undoped or doped polysilicon. Where polysilicon is used, second electrode layer 106 can be doped in situ or may be doped by other known means after formation of second electrode layer 106.

Cap layer 107 is preferably a deposited oxide such as CVD deposited tetraethyloxysilane (TEOS). As will be seen, cap layer 107 serves as a hard mask during subsequent etch steps and so the particular material chosen for cap layer 107 should be easily etchable and have a low differential etch rate and/or significant thickness to withstand an etch of etch stop layer 104, first electrode layer 103, and gate oxide 102.

While the preferred embodiment is described in terms of a polysilicon gate structure, it is apparent that other materials may be used to achieve the goals and advantages of the present invention.

3. Partial Completion of Gate Electrode

Figure 2:
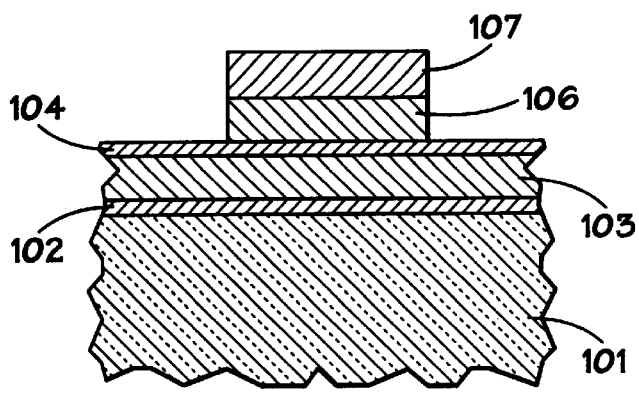
FIG. 2 is a cross-sectional view of the substrate shown in FIG. 1 after formation of a partial gate electrode structure.

FIG. 2 illustrates the semiconductor device in accordance with the present invention where the gate stack structure of FIG. 1 has been processed to partially form the gate electrode structure. In the processing that results in the structure shown in FIG. 2 the gate mask is used to pattern and etch cap layer 107 and upper electrode layer 106. In this manner the gate pattern is transferred to the surface of substrate 101 using conventional lithography techniques.

Cap layer 107 is anisotropically etched in the preferred embodiment. Where cap layer 107 is oxide and upper electrode 106 is polysilicon typical oxide etch chemistries will not etch polysilicon at a significant rate. Hence, when the etch rate drops off, the etch chemistry must be changed to etch polysilicon rather than oxide. In this manner cap 107 acts as a hard mask for polysilicon or upper electrode layer 106.

During the polysilicon etch one or more gaseous by-products of the polysilicon etch in the plasma are monitored. Due to the differing chemical composition of the etch-stop layer the concentrations of the etch by-products in the plasma can be used to detect the "end point" of the first polysilicon layer etch. Furthermore, preferably, etch stop layer material 104 is chosen such that as the polysilicon etch exposes etch stop 104 the etch rate will be significantly reduced at which time the first polysilicon etch should be stopped. So long as etch stop layer 104 etches much slower than upper electrode 106, etch stop layer 104 will serve its function.

In one embodiment, etch stop layer 104 primarily serves as an end point detector, therefore any combination of materials that can be etched such that it is readily apparent when upper electrode 106 has been completely etched through would be an equivalent structure to that disclosed in the preferred embodiment. Etch stop layer 104 may comprise a native oxide less than 50 angstroms thick. Alternatively, etch stop layer 104 may be a doped surface layer at the top surface of first electrode layer 103 or at a bottom surface of upper electrode layer 106 as doping changes can be used for end point detection. At this point in processing formation of the gate stack is interrupted or postponed until the heavily doped drain and lightly doped drain structures are formed.

In another embodiment, upper electrode 106 comprises conductive tungsten silicide ($WSi_x$) and first electrode layer 103 comprises doped or un-doped polysilicon. During the etch process, a transition from $WSi_x$ to polysilicon can easily be detected by monitoring W content in the etch gasses. Other combinations of materials that serve the end-point detection and/or etch stop function described herein are equivalent to the preferred implementations specifically described herein.

4. Sidewall Formation

Figure 3:
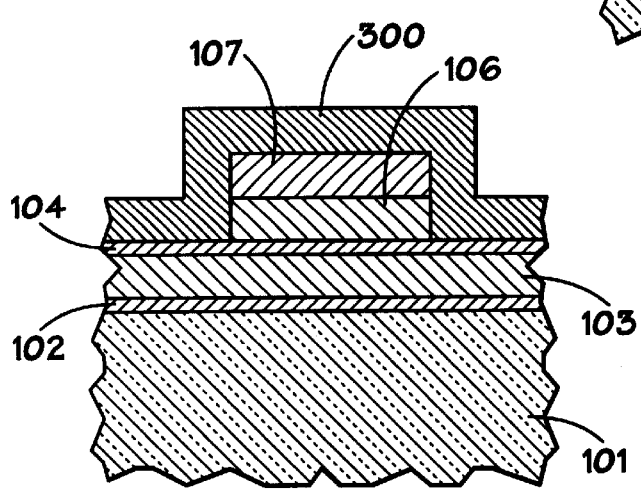
FIG. 3 illustrates a semiconductor structure of FIG. 2 in cross-section at a further stage of processing.
Figure 4:
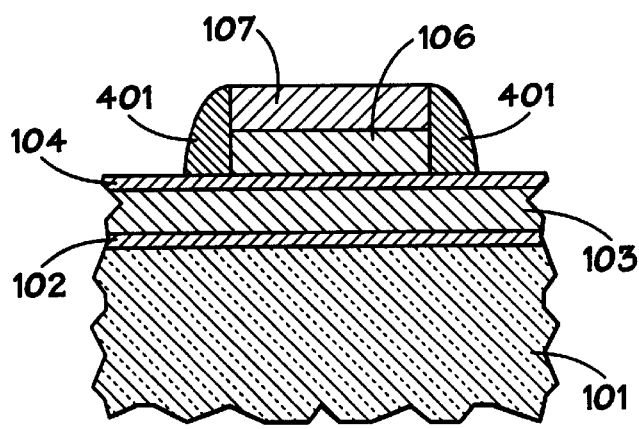
FIG. 4 illustrates a semiconductor structure in accordance with the present invention after formation of sidewall spacers.

FIG. 3 and FIG. 4 illustrate formation of sidewall spacers in accordance with the present invention. The partially completed gate stack structure shown in FIG. 2 is covered with a deposited oxide or nitride layer of thickness suitable for forming. a sidewall spacer 401 shown in FIG. 4. During subsequent etching, spacer 401 is formed having a suitable width to achieve the desired spacing of the source/drain implant from the gate as shown in FIG. 4. Preferably, CVD deposition process is used to ensure a conformal coating around the partially completed gate electrode structure. While it is preferable to use oxide or nitride, other sidewall materials are known as are other processes for depositing thin films that may produce acceptable results in particular applications.

The structure shown in FIG. 3 is subjected to anisotropic etch selective to polysilicon layer 103 resulting in the structure shown in FIG. 4. The anisotropic etch is performed with sufficient over etch to completely remove it from the exposed active regions outside the gate electrode. A great deal of latitude is available in the amount of over etch used to form sidewall spacers 401 because spacers 401 will eventually be disposed of as will etch stop layer 104 and the cap layer 107. Hence, the etch can also be easily continued until the desired lateral dimension is achieved. Significantly, silicon substrate 101 is not exposed during the sidewall etch hence no surface damage results due to exposure to the plasma during the anisotropic etch step.

5. Drain Formation

Figure 5:
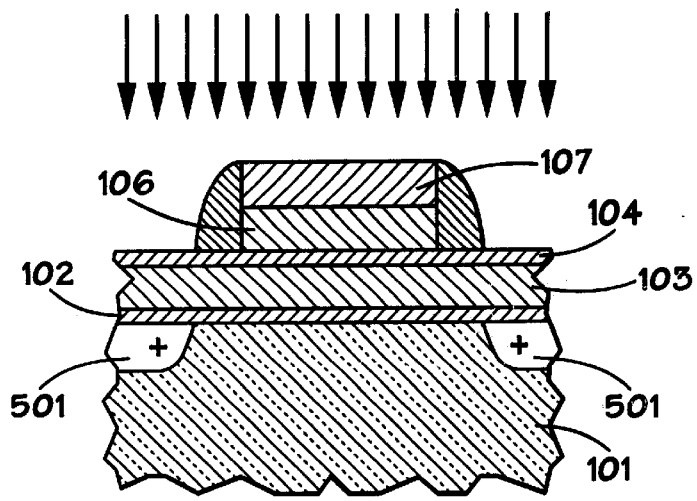
FIG. 5 illustrates a semiconductor structure of FIG. 4 during formation of a heavily doped drain region.

Heavily doped drain regions 501 are formed by high current implantation as shown in FIG. 5. High current, high energy implantation is used to implant through etch stop layer 104, lower electrode layer 103, and gate oxide 102. The high current implantation for the highly doped drain region uses the partially etched gate electrode and sidewalls 401 as a mask. The lateral boundaries of highly doped drain regions 501 are thus laterally spaced from the edges of the gate electrode as defined by cap 107 and upper gate electrode 106.

Subsequently, sidewall spacers 401 are removed by any convenient process. Any wet etch or dry etch that is selective so as not to etch upper electrode 106 significantly is acceptable to remove spacers 401. Optionally, etch stop layer 104 may be etched during the spacer removal, although this is not necessary. Importantly, gate oxide 102 is never exposed during the etch used to remove spacers 401. Hence, gate oxide 102 cannot be undercut or damaged during this process.

The heavily doped source/drain implantation step shown in FIG. 5 can also be used to dope upper electrode 106 if desired. If this is desired, cap 107 should be made thin enough to allow significant impurity penetration during the high current implantation process. As discussed hereinbefore, there are other equivalent methods of doping upper electrode 106.

After heavily doped source/drain implantation, regions 501 indicated by plus signs in FIG. 5 are formed. The structure either before or after sidewall spacer removal is annealed to remove damage from the high current implant. Optionally, thermal processing can be performed to redistribute the impurities in highly doped drain regions 501 or to further remove implant damage.

Figure 6:
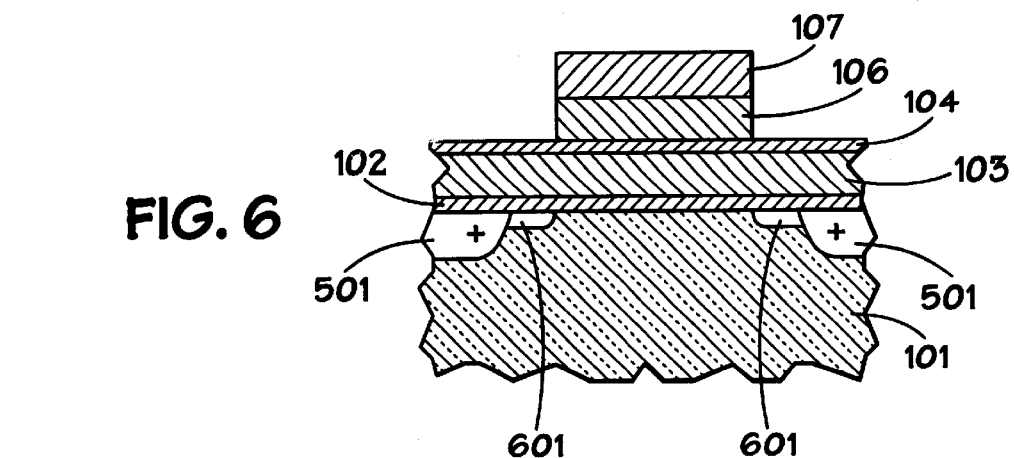
FIG. 6 illustrates a semiconductor structure of FIG. 5 after removal of the sidewall spacers and formation of lightly doped drain regions.

Referring to FIG. 6, when sidewall spacers 401 are removed, a low current high energy implant is performed to create LDD regions 601. The LDD implant creates a low density of impurities of the same conductivity type as the high current implant in the upper surface of substrate 101. The LDD implant shown in FIG. 6 is masked by the partially formed gate electrode including cap 107 and upper electrode layer 106. Hence, the LDD region is immediately adjacent to the gate electrode.

Optionally, the LDD implant shown in FIG. 6 can be performed so that the ions are implanted at an angle. An angled implant increases the number of ions implanted beneath the gate electrode. An angled implant can be performed with n-type ions into a p-type active area to form LDD regions as described above. Alternatively, a p-type angled implant can be used to lower resistivity of the p-type active area and increase punchthrough voltage of the transistor. In some designs both n-type and p-type angled implants may be used, or an angled p-type implant may be used in conjunction with an n-type implant at a shallower angle or substantially perpendicular. The conductivity types specified above can be alternated to provide transistors of opposite conductivity type from the preferred embodiments as is understood in the semiconductor industry.

If desired, cap 107 and upper electrode 106 can be coated with a thin oxide or nitride layer (not shown) prior to one or more of the LDD/punchthrough implants. This thin oxide or nitride layer will provide a small lateral spacing between the edge of the gate electrode and the LDD region. This is particularly desirable if subsequent thermal processing is expected that might drive LDD region 601 farther under the gate electrode. In these cases, the additional oxide or nitride layer can reduce overlap capacitance caused by excessive overlap of the gate electrode over the drain regions.

Figure 7:
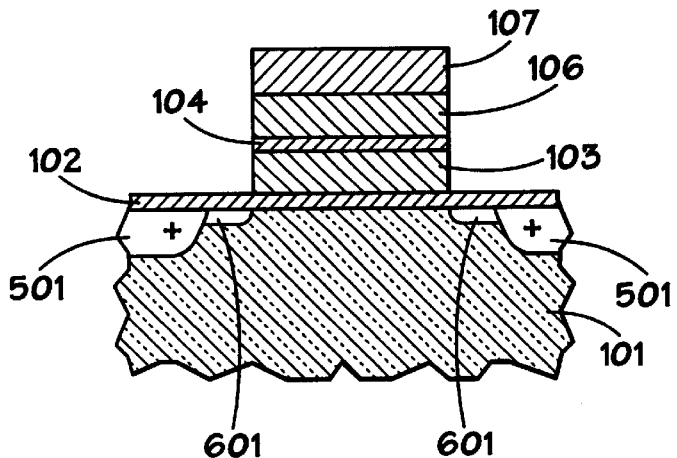
FIG. 7 illustrates a partially completed semiconductor device in accordance with the present invention before formation of contacts and wiring.

As shown in FIG. 7, etch stop layer 104 and lower electrode layer 103 are subsequently etched using the partially formed gate electrode (i.e., cap 107) as a hard mask.

I claim:

1. A method for fabricating a field effect transistor comprising the steps of:

providing a semiconductor substrate;

forming a gate insulator layer covering the substrate;

forming a first conductive layer on the gate insulator layer;

forming an etch stop layer on the upper surface of the first conductive layer wherein the etch stop layer comprises undoped polysilicon formed contiguously with the first conductive layer;

forming a second conductive layer covering the etch stop layer;

forming a hard mask layer on the second conductive layer;

patterning the hard mask layer to define a gate hard mask;

etching the second conductive layer using the patterned hard mask as a mask to expose portions of the etch stop layer;

forming sidewall spacers along exposed edges of the second conductive layer;

implanting impurities through the etch stop layer, the first conductive layer, and the gate oxide using the patterned hard mask layer and the sidewall spacers as a mask to self-align source/drain regions;

removing the sidewall spacers;

etching the etch stop layer and the first conductive layer using the patterned hard mask as a mask; and implanting impurities through the first conductive layer and gate oxide using the hard mask as a mask to form lightly/doped source and drain regions.

2. The method of claim 1 wherein the first and second conductive layers comprise polysilicon.

3. The method of claim 1 wherein the step of forming a hard mask layer comprise CVD deposition of very thin silicon oxide.

4. The method of claim 1 wherein the step of forming a hard mask comprises, CVD deposition of a silicon dioxide layer.

5. The method of claim 1 further comprising the step of depositing a thin film of ion blocking material onto the sidewalls of the second conductive layer, the etch stop layer, and the first conductive layer before the step of implanting impurities to form lightly doped source and drain regions.

6. A method of forming a MOS transistor in an upper surface of a semiconductor substrate comprising the steps of:

forming a gate oxide layer covering the upper surface of the substrate;

forming a gate stack comprising one or more thin film layers over the gate oxide layer, wherein the step of forming a gate stack further comprises:

forming a first polysilicon layer;

forming a $WSI_x$ layer covering the first polysilicon layer;

forming a second polysilicon layer covering the $WSI_x$ layer, wherein the composition of the second polysilicon layer is chosen to etch faster than the composition of the $WSI_x$ layer covering the first polysilicon layer; and forming a deposited oxide layer covering the second polysilicon layer;

partially etching a gate electrode pattern into the gate stack, the partial etching step being completed before any gate oxide is exposed;

forming sidewall spacers on edge surfaces of the partially formed gate electrode;

forming source and drain regions by ion implantation using the partially etched gate electrode and the sidewall spacers as a mask;

removing the sidewall spacers; and forming lightly doped drain regions by ion implantation using the partially etched gate electrode as a mask.

7. The method of claim 6 wherein the step of forming a gate stack further comprises the step of:

doping the second polysilicon layer with impurities that increase its etch rate.

8. The method of claim 6 wherein the step of partially etching further comprises:

providing a mask over the deposited oxide layer;

anisotropically etching the deposited oxide to form a gate hard mask;

anisotropically etching the second polysilicon layer; and discontinuing the anisotropic etch of the second polysilicon layer when the etch rate decreases below a preselected threshold.

9. A method for fabricating a field effect transistor comprising the steps of:

providing a semiconductor substrate;

forming a gate insulator layer covering the substrate;

forming a first conductive layer on the gate insulator layer;

forming an etch stop layer on the upper surface of the first conductive layer, wherein the etch stop layer comprises a metal silicide;

forming a second conductive layer covering the etch stop layer;

forming a hard mask layer on the second conductive layer;

patterning the hard mask layer to define a gate hard mask;

etching the second conductive layer using the patterned hard mask as a mask to expose portions of the etch stop layer;

forming sidewall spacers along exposed edges of the second conductive layer;

implanting impurities through the etch stop layer, the first conductive layer, and the gate oxide using the patterned hard mask layer and the sidewall spacers as a mask to self-align source/drain regions;

removing the sidewall spacers;

etching the etch stop layer and the first conductive layer using the patterned hard mask as a mask; and implanting impurities through the first conductive layer and gate oxide using the hard mask as a mask to form lightly doped source and drain regions.

10. The method of claim 9 wherein the first and second conductive layers comprise polysilicon.

11. The method of claim 9 wherein the step of forming a hard mask layer comprise CVD deposition of very thin silicon oxide.

12. The method of claim 9 wherein the step of forming a hard mask comprises CVD deposition of a silicon dioxide layer.

13. The method of claim 9 further comprising the step of depositing a thin film of ion blocking material onto the sidewalls of the second conductive layer, the etch stop layer, and the first conductive layer before the step of implanting impurities to form lightly doped source and drain regions.

14. A method for fabricating a field effect transistor comprising the steps of:

providing a semiconductor substrate;

forming a gate insulator layer covering the substrate;

forming a first conductive layer on the gate insulator layer;

forming an etch stop layer on the upper surface of the first conductive layer;

forming a second conductive layer covering the etch stop layer;

forming a hard mask layer on the second conductive layer;

patterning the hard mask layer to define a gate hard mask;

etching the second conductive layer using the patterned hard mask as a mask to expose portions of the etch stop layer;

forming sidewall spacers along exposed edges of the second conductive layer;

implanting impurities through the etch stop layer, the first conductive layer, and the gate oxide using the patterned hard mask layer and the sidewall spacers as a mask to self-align source/drain regions;

removing the sidewall spacers;

etching the etch stop layer and the first conductive layer using the patterned hard mask as a mask; and implanting impurities through the first conductive layer and gate oxide using the hard mask as a mask to form lightly doped source and drain regions;

depositing a thin film of ion blocking material onto the sidewalls of the second conductive layer, the etch stop layer, and the first conductive layer before the step of implanting impurities to form lightly doped source and drain regions.

15. The method of claim 14 wherein the first and second conductive layers comprise polysilicon.

16. The method of claim 14 wherein the etch stop layer comprises very thin silicon oxide which first and second conductive layers are electrically coupled through the etch stop.

17. The method of claim 16 wherein the first conductive layer comprises polysilicon and the etch stop layer comprises thermally grown silicon oxide.

18. The method of claim 14 wherein the step of forming a hard mask layer comprise CVD deposition of very thin silicon oxide.

19. The method of claim 14 wherein the step of forming a hard mask comprises CVD deposition of a silicon dioxide layer.

* * * * *